(12) United States Patent
Goebbels et al.

(10) Patent No.: US 10,804,686 B2
(45) Date of Patent: Oct. 13, 2020

(54) BUSBAR ASSY SUPPORT FOR PCB

(71) Applicant: Hanon Systems, Daejeon (KR)

(72) Inventors: Bernadette Goebbels, Cologne (DE); Stephan Werker, Merzneich-Golzheim (DE); Sandra Moravek, Wetzlar (DE)

(73) Assignee: HANON SYSTEMS, Daejeon (KR)

( * ) Notice: Subject to any disclaimer, the term of this patent is extended or adjusted under 35 U.S.C. 154(b) by 317 days.

(21) Appl. No.: 15/863,099

(22) Filed: Jan. 5, 2018

(65) Prior Publication Data

US 2018/0198267 A1    Jul. 12, 2018

(30) Foreign Application Priority Data

Jan. 9, 2017  (DE) .................. 10 2017 100 251

(51) Int. Cl.

| | |
|---|---|
| *H02G 5/06* | (2006.01) |
| *H05K 7/14* | (2006.01) |
| *H02K 5/00* | (2006.01) |
| *F04B 35/01* | (2006.01) |
| *H02K 11/33* | (2016.01) |
| *B60H 1/32* | (2006.01) |
| *H05K 5/00* | (2006.01) |
| *H05K 5/02* | (2006.01) |

(52) U.S. Cl.
CPC ............ *H02G 5/06* (2013.01); *B60H 1/3229* (2013.01); *F04B 35/01* (2013.01); *H02K 5/00* (2013.01); *H02K 11/33* (2016.01); *H05K 5/006* (2013.01); *H05K 5/0008* (2013.01); *H05K 5/0052* (2013.01); *H05K 5/0221* (2013.01); *H05K 7/1432* (2013.01); *B60H 2001/3292* (2013.01)

(58) Field of Classification Search
CPC ........................................................ H02G 5/06
USPC ........................................................ 174/520
See application file for complete search history.

(56) References Cited

U.S. PATENT DOCUMENTS

| | | | |
|---|---|---|---|
| 2,783,299 A | 2/1957 | Schymik | |
| 5,228,798 A | * 7/1993 | Tzanovici | ............. E05B 1/0015 292/350 |
| 8,698,364 B2 | 4/2014 | Saito et al. | |
| 2011/0211981 A1 | 9/2011 | Saito et al. | |

(Continued)

FOREIGN PATENT DOCUMENTS

| | | |
|---|---|---|
| CN | 103904912 A | 7/2014 |
| DE | 3734804 A1 | 4/1989 |
| DE | 69010755 T2 | 12/1994 |

(Continued)

*Primary Examiner* — Stanley Tso
(74) *Attorney, Agent, or Firm* — Shumaker, Loop & Kendrick, LLP; James D. Miller

(57) ABSTRACT

The invention relates to a device for receiving and supporting busbars as electrical connection elements for a circuit board. The device is arranged in a gap between the circuit board and a housing wall, in contact with the circuit board and with the housing wall, and comprises a housing which receives at least one busbar and which, on a first end, is designed with a supporting element for holding the device on the housing wall. Here, the housing wall is designed with a screw base of a screw connection, and the supporting element is designed in the form of an eyelet such a manner that the supporting element encloses the screw base at least partially, and the circuit board is connected on a front side of the screw base to the housing wall.

15 Claims, 4 Drawing Sheets

(56) References Cited

U.S. PATENT DOCUMENTS

| | | | |
|---|---|---|---|
| 2016/0066460 A1* | 3/2016 | Rayner | A45C 13/008 224/191 |
| 2018/0027646 A1* | 1/2018 | Sumida | H05K 7/1432 361/720 |

FOREIGN PATENT DOCUMENTS

| | | |
|---|---|---|
| DE | 600032682 T2 | 11/2007 |
| DE | 600032683 T2 | 11/2007 |
| GB | 599995 A | 3/1948 |
| JP | 2003324903 A | 11/2003 |
| JP | 2011124740 A | 6/2011 |
| JP | 2012139055 A | 7/2012 |
| JP | 2014113053 A | 6/2014 |
| KR | 950009659 Y1 | 11/1995 |
| KR | 20150037721 A | 4/2015 |
| KR | 20160001383 U | 4/2016 |

* cited by examiner

US 10,804,686 B2

BUSBAR ASSY SUPPORT FOR PCB

CROSS-REFERENCE TO RELATED APPLICATIONS

This application claims priority to German Patent Application No. 10 2017 100251.0, filed on Jan. 9, 2017, the disclosure of which is incorporated herein by reference in its entirety.

FIELD

The invention relates to a device for receiving and supporting busbars as electrical connecting elements for a circuit board.

BACKGROUND

During the installation of circuit boards, also referred to as printed circuits, boards or printed circuit boards, abbreviated PCB in English, for use in high-current technology with current intensities >10 A, busbars are commonly used for the electrical connection of individual subassemblies. The busbars are usually formed as stamped bent elements and have contacts or insertion sleeves at the ends.

The circuit boards are used as support for electronic elements and for the mechanical fastening and electrical connection thereof. During assembly or when connecting individual elements to form a subassembly, the circuit boards and other elements to be connected are plugged together. Here, either the circuit boards and other individual electronic elements are inserted into the busbars, or the busbars are inserted into the circuit boards or into the electronic elements.

In addition, it is known from the prior art to embed the busbars for preliminary fixation in a component formed from a plastic or another electrically nonconductive material. In this way, the position and the arrangement of the busbar in a certain position are defined. Furthermore, the components for the fixation of the busbars are used additionally as electrical isolators of the busbars to isolate them from one another or with respect to other electronic elements arranged adjacently.

The conventional components formed from a plastic for the fixation of the busbars in a certain position prevent simple tolerance compensation between the individual elements of a subassembly, which is necessary for a mechanical stress-free or at least low mechanical stress assembly of the elements.

During assembly of the circuit boards, busbars and electronic elements to form subassemblies, considerable stresses can moreover act, for example, on the circuit board, due to the occurring insertion forces. Thus, during assembly, there is already a risk of damaging the circuit board or other components on the circuit board. In particular, the risk of damage caused by high mechanical stresses is very high when the circuit board is fixed in an insertion position by tightening screws and at the same time busbars are inserted into the circuit board.

FIG. 1 shows a system consisting of a circuit board 1' and busbars 2' arranged fixedly on the circuit board 1'. The busbars 2' comprise clamping devices 3' for receiving pin connections 8, for example, of an electric motor of a compressor. The pin connections 8 are formed by being led in an isolated manner through a housing wall 7 of the compressor.

The circuit board 1' is screwed to the housing wall 7 via laterally arranged screw connections 4. The screw connections 4 each comprise a screw 5 which is screwed into the housing wall 7 through a passage opening formed in the circuit board 1'. In the area of the screw connections 4, the housing wall 7 is designed with screw bases 6', so that the screws 5 of the screw connections 4 engage in the screw base 6'. The clamping devices 3' of the busbars 2' fixed to the circuit board 1' are arranged substantially centrally between the screw connections 4.

During assembly of the circuit board 1' with the busbars 2' and the pin connections 8 of the compressor, the circuit board 1' is moved in assembly direction 9 towards the housing wall 7 with the pin connections 8 protruding from the housing wall 7. The circuit board 1' is pressed towards the housing wall 7 by tightening of the screws 5 of the respective laterally arranged screw connections 4, while the pin connections 8 engage in the clamping devices 3' of the busbars 2' fixed to the circuit board 1'. The clamping devices 3', designed as spring sleeves, for example, are plugged onto the ends of the pin connections 8. Here, the forces F applied by means of the screws 5 act in direction of the assembly direction 9. However, the forces F occurring during the insertion of the pin connections 8 into the clamping devices 3' act counter to the assembly direction 9. The circuit board 1' is strongly stressed and bent, which can lead to damaging the circuit board 1' and elements fixed to the circuit board 1'. The forces occurring during the assembly of the busbars 2' with the pin connections 8 are transmitted via the circuit board 1'.

SUMMARY

The aim of the invention consists in providing a device for supporting and fixing busbars in a certain position with respect to a circuit board. By using the device, it should be possible to compensate for tolerances of production and arrangement of individual components, in order to prevent mechanical stresses. In addition, in particular during assembly of a subassembly, forces acting on the circuit board, which lead to mechanical stresses, should be prevented or at least minimized. The device should thus enable a sufficient fixation of the busbars during the assembly, in particular during series production, and also a lateral tolerance compensation for the manufacturing tolerances. In addition, the busbars should be electrically isolated from one another and also with respect to other components of the subassembly. The production costs and the weight of the device should be minimal. The installation space of the device should be minimal.

The aim is achieved by the subject matter shown and described herein.

The aim is achieved by a device according to the device for receiving and supporting busbars as electrical connecting elements for a circuit board.

According to the design of the invention, the device is arranged in a gap between the circuit board and a housing wall, in contact with the circuit board and with the housing wall, and it comprises a housing which receives and supports at least one busbar and which, on a first end, is designed with a supporting element for holding the device on the housing wall.

Here, according to the invention, the housing wall is designed with a screw base of a screw connection, and the supporting element is designed in the form of an eyelet, in such a manner that the supporting element encloses the screw base at least partially, and the circuit board is connected on a front side of the screw base to the housing wall, in particular by screw connection.

A screw is advantageously screwed through the circuit board into the screw base in such a manner that the circuit board is fixed and braced between a head of the screw and a front side of the screw base or the supporting element.

According to a development of the invention, an inner side of the supporting element designed in the form of an eyelet is designed to be conical and an outer side of the screw base is designed to be conical or the screw base itself is designed in the shape of a truncated cone, so that the inner side of the supporting element and the outer side of the screw base correspond to one another and are in flat contact with one another.

The free front side of the screw base preferably has a smaller cross-sectional area or a smaller diameter than the base surface of the screw base connected to the housing wall.

According to an advantageous design of the invention, the housing of the device is formed from a first housing element and a second housing element.

An embodiment of the invention consists in that the at least one busbar comprises a clamping device on a first end, and the device, on a side facing the housing wall, is designed with at least one passage opening corresponding to the arrangement of the clamping device, in such a manner that a pin connection protruding from the housing wall can be inserted through the passage opening into the clamping device.

The at least one passage opening, which is formed advantageously on the first housing element, preferably has a conical shape for the implementation of the pin connection, wherein the passage opening tapers in the movement direction of the pin connection when the components are plugged together.

An additional advantageous design of the invention consists in that the at least one busbar comprises a plug connection on a second end, and the device, on a side facing the circuit board, is designed with at least one passage opening corresponding to the arrangement of the plug connection, in such a manner that the plug connection is arranged so that it protrudes from the device through the passage opening in direction of the circuit board.

The at least one passage opening for the implementation of the plug connection is preferably formed on the second housing element.

According to a development of the invention, the device is provided for receiving and supporting three busbars.

The housing of the device is advantageously formed from an electrically nonconductive material, in particular a plastic.

The housing elements preferably comprise locking elements for clipping or locking to one another.

According to an advantageous design of the invention, the supporting element comprises a slot and is designed in the form of an open eyelet. The slot thus extends in the direction of the longitudinal axis of the eyelet. The supporting element is preferably arranged on the second housing element.

An additional embodiment of the invention consists in that the housing of the device comprises a fastening eyelet which is designed as a through-hole for receiving a pin or a screw and which is formed on a second end of the device which is distal with respect to the first end.

The fastening eyelet is advantageously arranged on the first housing element.

According to a development of the invention, the housing of the device is designed with passage openings for implementation and preliminary fixation of electrical connections of electronic components arranged on the housing wall for the connection to the circuit board.

The electronic components can be semiconductor elements, for example.

The passage openings for implementation and preliminary fixation of the electrical connections, in particular of the semiconductor elements, are advantageously formed on the second housing element.

The housing of the device can comprise formations designed as spacers, so that the device is in contact with the housing wall by means of formations and/or is in contact with the circuit board by means of formations and the supporting element.

The advantageous design of the invention enables the use of the device in connection with an electrically driven compressor of a refrigeration circuit, in particular of an air conditioning system for conditioning the air of a passenger space of a motor vehicle.

In summary, the device according to the invention for receiving and supporting busbars has various additional advantages:
- fixing the busbars in a certain position with respect to the circuit board,
- compensating for lateral tolerances of production and arrangement of individual components with respect to the circuit board, and consequently lowering requirements for the production tolerances of the components,
- mechanical stress-free assembly of the components, in particular of the circuit board,
- consequently also rapid and reliable assembly of the individual components and minimal production waste,
- electrical isolation of the busbars both for isolating them from one another and also with respect to other components of the subassembly, and
- minimal production costs, minimal weight and minimal installation space.

BRIEF DESCRIPTION OF THE DRAWINGS

Additional details, features and advantages of designs of the invention can be obtained from the following description of embodiment examples in reference to the associated drawings. In the drawings.

DETAILED DESCRIPTION OF EMBODIMENTS

Figure 1:
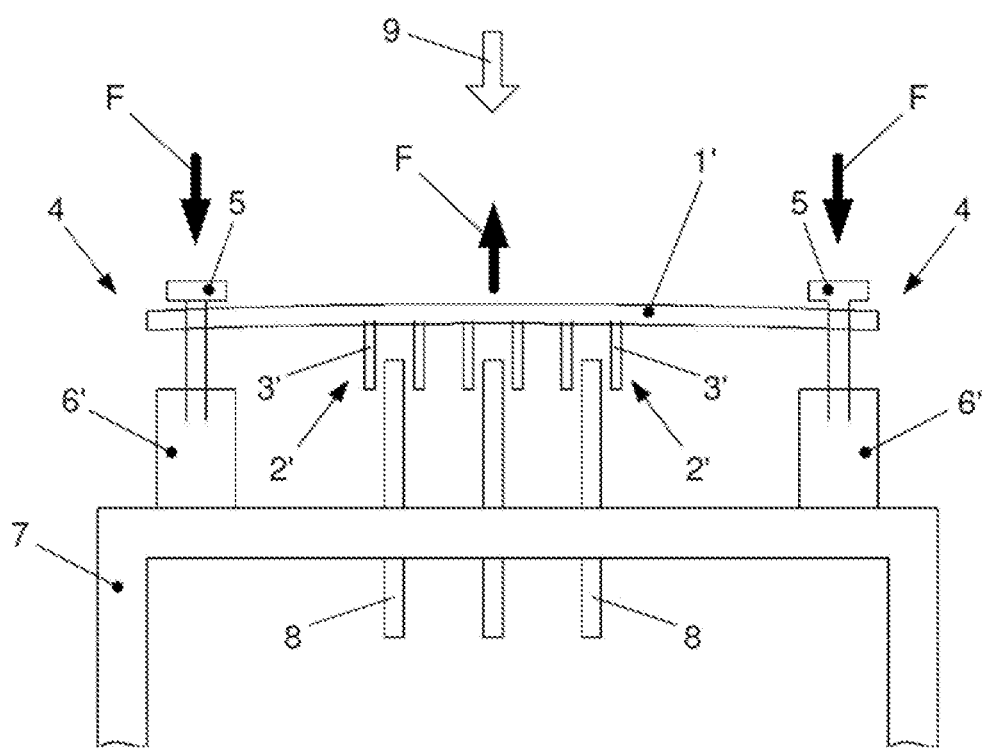
FIG. 1 shows a system consisting of a circuit board and busbars arranged fixedly on the circuit board.
Figure 2:
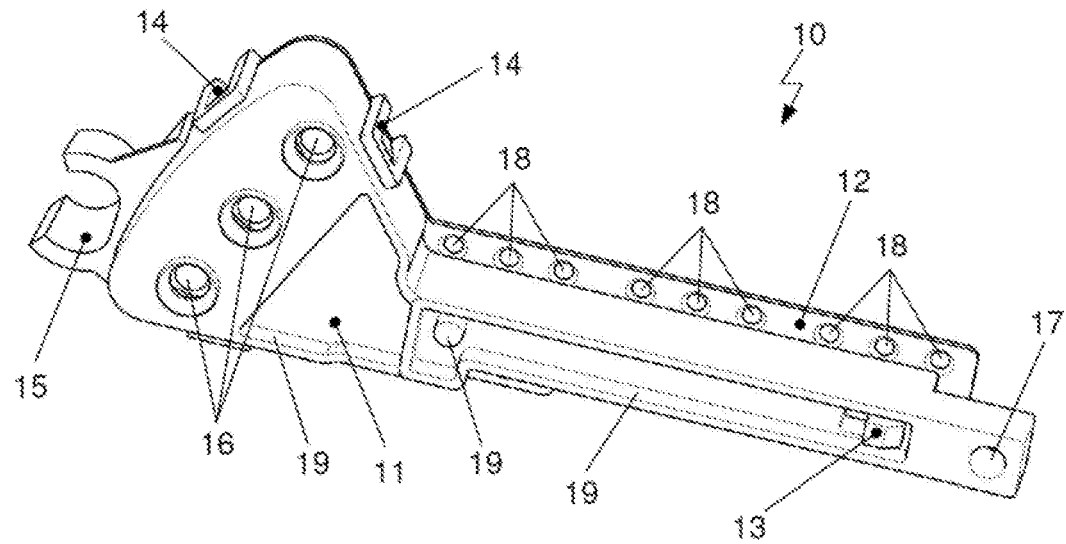
FIG. 2 shows a device for receiving and supporting busbars with a supporting element and passage openings for pin connections.

In FIG. 2, a device 10 for receiving and supporting busbars with a supporting element 15 and passage openings 16 for pin connections is shown. The device 10, formed from a plastic or another electrically nonconductive material, comprises a first housing element 11 and a second housing element 12, which are each designed in the form of a half shell, complement one another in the plugged-together state and enclose a volume.

The housing elements 11, 12 are connected to one another after the insertion or embedding of the busbars, which are not represented, so that busbars arranged in the interior between the housing elements 11, 12 are firmly fixed. The housing elements 11, 12 of the device 10 are clipped or locked to one another. Here, on locking elements 13, 14 formed on the housing elements 11, 12 engage in one another and fix the first housing element 11 to the second housing element 12. The first locking element 13 designed as hook shaped engages on the second housing element 12 through an opening in the wall of the first housing element 11. Here, the hook of the first locking element 13 is locked to the wall of the second housing element 12 of the device 10. The second locking elements 14 are designed in such a manner that, when the device 10 is plugged together, loops formed on the second housing element 12 of the device 10 slide over hooks formed on the first locking element 13 and engage. Here, the loops of the second locking element 14 engage with the hooks formed on the wall of the first housing element 12 of the device 10.

The device 10 has an elongate form with side edges oriented substantially parallel to one another and with a uniformly broadening first end, on which the supporting element 15 designed as a supporting eyelet is arranged. The supporting element 15 is formed on the second housing element 12. The eyelet of the supporting element 15 has a slot in longitudinal direction and is open. The longitudinal direction here corresponds to the axial direction of the though-hole designed as eyelet.

In the area of the uniform broadening, the first housing element 11 of the device 10 comprises three passage openings 16 for receiving pin connections which are not represented. In the assembled state of the device 10, the pin connections are inserted at the installation site through the passage openings 16 into the device 10 and connected electrically and mechanically with the busbars within the device 10. The passage openings 16 are designed to be conical or in the shape of a cone for improved insertion of the pin connections into the device 10, wherein, during assembly, the larger circumferences of the passage openings 16 are oriented in each case in the direction of the ends of the pin connections which are to be inserted into the device 10.

Figure 3A:
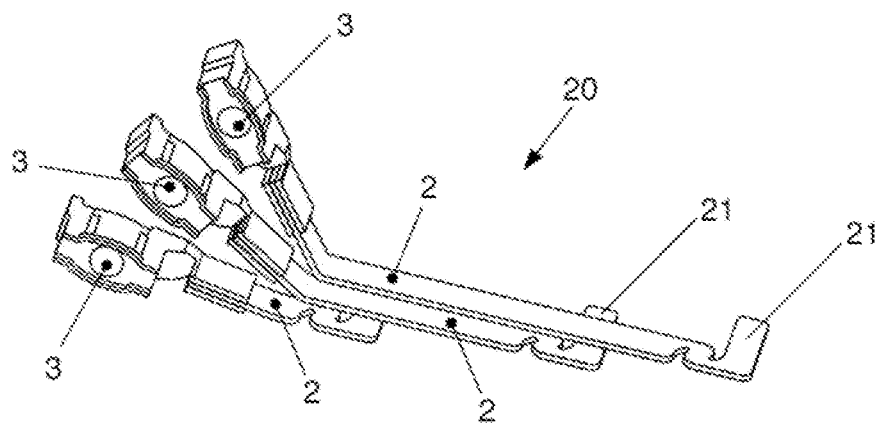
FIG. 3A shows an arrangement of busbars, for example, of a three-phase current supply.
Figure 3B:
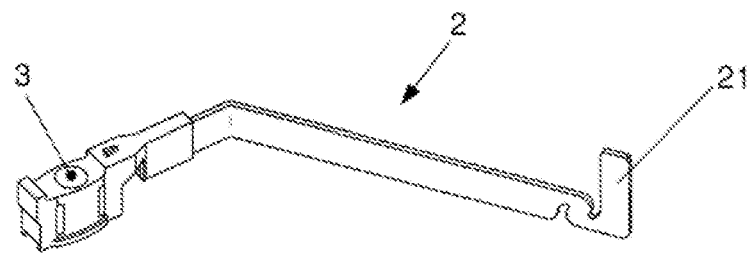
FIG. 3B shows an individual busbar of an arrangement of busbars from FIG. 3A.

FIG. 3A shows an arrangement 20 of busbars 2, for example, of a three-phase current supply, within the device 10. In FIG. 3B, a single busbar 2 of an arrangement 20 of the busbars 2 from FIG. 3A is represented.

In each case, the busbars 2 comprise a first end with a clamping device 3. The clamping device 3 is here designed as an opening, in particular a passage opening, preferably as a press-in sleeve or as a spring sleeve, for receiving pin connections 8. The passage openings 16 formed in the first housing element 11 of the device 10 and the clamping devices 3 of the busbars 2 are arranged in correspondence with one another, so that the pin connections 8 inserted through the passage openings 16 into the device 10 are also inserted into the clamping devices 3 of the busbars. The busbars 2 are designed and arranged in such a manner that the ends designed with the clamping devices 3 fan out and are adapted to the uniformly broadening first end of the device 10.

In addition, the busbars 2 in each case have a straight area, busbars which, in the assembled state, are arranged within the elongate shape with side edges of the device 10 oriented substantially parallel to one another. On the second end, which is distal relative to the first end, the busbars 2 in each case are designed with a plug connection 21. In the assembled state of the device 10, the plug connections 21 protrude from the device 10, in particular through the second housing element 12.

On the second end, which is distal with respect to the first end of the device 10, the device 10, according to FIG. 2, comprises an additional fastening eyelet 17 which is designed as a through-hole for receiving a pin or a screw. While the supporting element 15 is formed on the second housing element 12 of the device 10, the fastening eyelet 17 is arranged on the first housing element 11 of the device 10. Both the supporting element 15 and also the fastening eyelet 17 are used for connecting the device 10 to a housing wall, for example, of a compressor.

In the assembled state, the device 10 is arranged between a circuit board and the housing wall. Here, the device 10 is in contact with the housing wall by means of the first housing element 11 and in contact with the circuit board by means of the second housing element 12. For spaced and secure contact with the housing wall, the first housing element 11 comprises formations 19 designed as spacers. Depending on the position and design of the corresponding contact surface of the housing wall, the formations 19 here have different designs such as point-type or strip-type supports.

For the fixation of additional connections, for example, of semiconductor elements which are also to be connected to the circuit board, the second housing element 12 of the device 10 is provided with additional passage openings 18. The passage openings 18 here are formed in a strip-type area protruding from the first housing element 11. The passage openings 18 are designed to be conical or in the shape of a cone for the improved implementation of the connections, wherein, during assembly, the larger circumferences of the passage openings 18 are in each case oriented in the direction of the ends of the connections which are to be passed through the passage openings.

Figure 4:
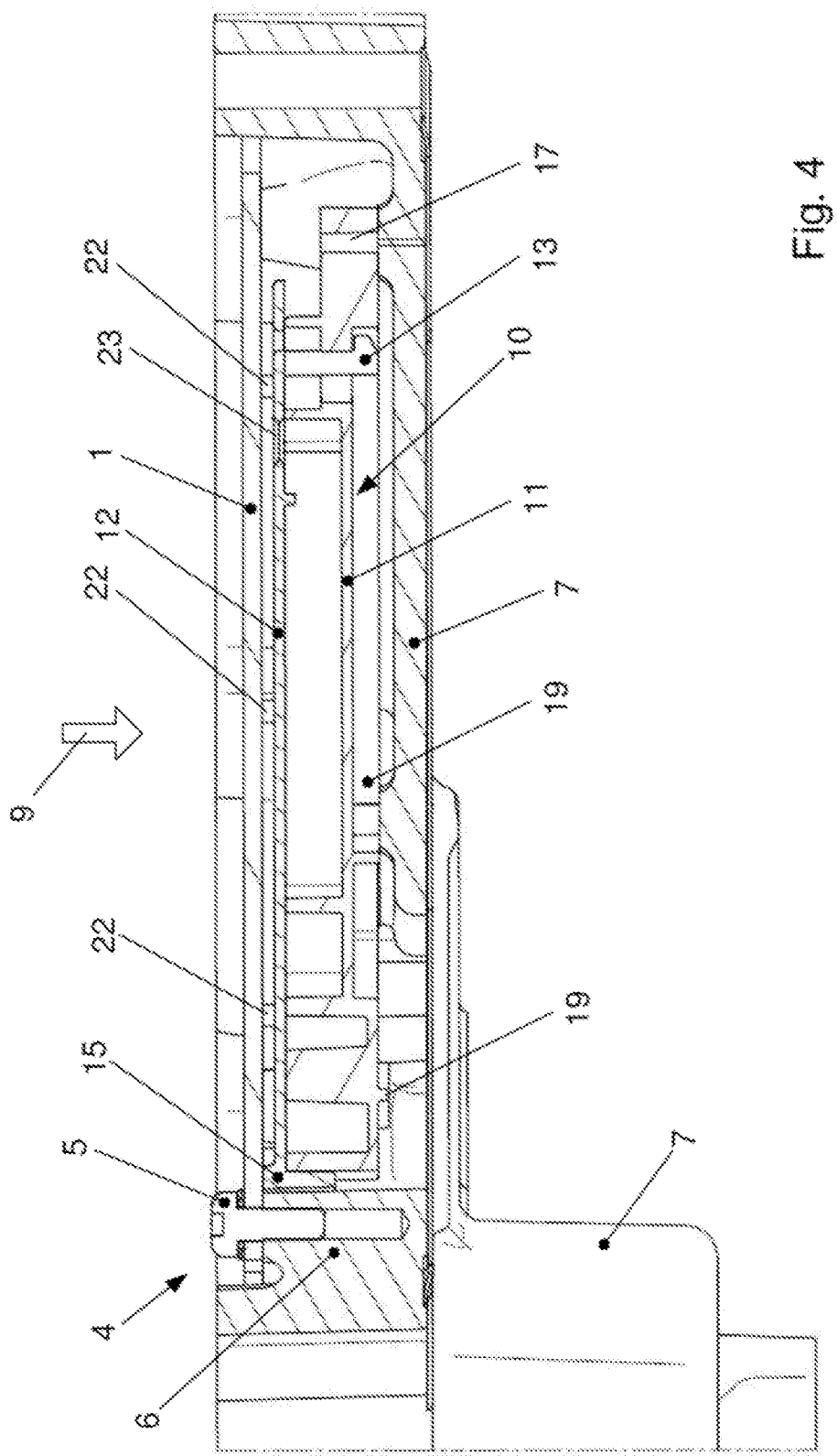
FIG. 4 shows a device for receiving and supporting busbars in the assembled state in a cross-sectional representation.

FIG. 4 shows the device 10 for receiving and supporting busbars in the assembled state in a cross-sectional representation. The busbars, not represented, connect pin connections protruding from the housing wall 7, which are not represented, to a circuit board 1 and, in the assembled state of the device 10, they are arranged substantially parallel to the circuit board 1 and thus in longitudinal orientation of the device 10.

Here, at the first ends, according to FIG. 3A or 3B, the busbars 2 are mechanically and electrically coupled to the pin connections 8 via the clamping devices 3. The pin connections 8 inserted through the passage openings 16 formed in the wall of the first housing element 11 according to FIG. 2 protrude into the passage openings of the clamping devices 3.

The plug connections 21 formed on the second ends of the busbars 2 are inserted through passage openings 23 formed in the wall of the second housing element 12 and extend up to the circuit board 1. In the area of the plug connections 21, the busbars 2 are mechanically and electrically coupled to the circuit board 1.

The device 10 is connected to the housing wall 7, for example, of a housing of a compressor, by means of the supporting element 15 which is formed on the first end, via a screw connection 4, and by means of the fastening eyelet 17 which is formed on the second end. The housing wall 7 comprises a screw base 6 as part of the screw connection 4.

The housing elements 11, 12 connected via the locking elements 13 so as to be locked or clipped to one another are in each case arranged with support against the housing wall 7 or the circuit board 1.

The first housing element 11, which is oriented towards the housing wall 7, is in contact with the housing wall 7, on the one hand, in the area of the formations 19 designed as spacers, and, on the other hand, in the area of the fastening eyelet 17. The device 10 can be fixed to the housing wall 7, for example, via a pin which is inserted through the fastening eyelet 17 or via a screw.

The second housing element 12, which is oriented towards the circuit board 1, is in contact with the circuit board 1, on the one hand, in the area of formations 22 which are also designed as spacers, and, on the other hand, in the area of the supporting element 15. The formations 22 are here of substantially point-type form, but they can also each have a strip-type form.

The device 10 is consequently arranged between the circuit board 1 and the housing wall 7 which receives the circuit board 1 and the device 10, in the assembly direction 9 under the circuit board 1.

The circuit board 1, which is screwed via a screw connection 4 to the housing wall 7, is braced between the head of a screw 5 which is screwed into the screw base 6 formed on the housing wall 7 and the front side of the screw base 6. The forces acting here are transmitted directly to the supporting element 15 of the device 10, which is arranged under the circuit board 1, and thus to the device 10, in the area of the supporting element 15.

The supporting element 15 of the device 10, which is designed as an eyelet, preferably as an open eyelet, is designed in terms of the dimensions in such a manner that, in the assembly of the device 10 in the assembly direction 9, it slides over the conical or frustoconical screw base 6. The diameter of the screw base 6 and the diameter of the supporting element 15 are configured in each case so that they taper in the direction opposite the assembly direction 9.

During the assembly, the busbars 2, according to FIGS. 3A and 3B, are embedded in the device 10, and the housing elements 11, 12 are closed in such a manner that the busbars 2 are fixed, and the plug connections 21 of the busbars 2 protrude from the second housing element 12 through the passage openings 23. The plug connections 21 later engage in the circuit board 1.

Subsequently, the device 10 is shifted with the internally located busbars 2 in the area of the supporting element 15 over the screw base 6 of the housing wall 7. The clamping devices 3 of the busbars 2 are inserted via the pin connections 8 protruding from the housing wall 7. The device 10 is formed with the busbars 2 separate from the circuit board 1 and the pin connections 8. The mechanical and electrical connections are in each case ensured only, on the one hand, via the clamping devices 3 of the busbars 2 to the pin connections 8, and, on the other hand, via the plug connections 21 of the busbars 2 to the circuit board 1.

In the assembly of the device 10, a lateral tolerance compensation of the device 10 and thus of the busbars 2, in particular of the clamping devices 3 with respect to the pin connections 8 and of the clamping connections 21 with respect to the circuit board 1 is ensured by means of an appropriately designed fit between the conical and open- or closed-design eyelet of the supporting element 15 of the device 10 and of the frustoconical screw base 6.

In the assembly of the busbars 2 as connecting elements between the pin connections 8 protruding from the housing wall 7 and the circuit board 1, the supporting element 15 is used in particular also to minimize the mechanical stresses transmitted to the circuit board 1.

The clamping connections 3 of the busbars 2 are arranged on the first end of the device 10 and thus in the area of the supporting element 15, so that forces which, when the pin connections 8 are plugged together with the clamping devices 3, act in the assembly direction 9 or opposite the assembly direction 9, are applied immediately adjacently to the supporting element 15 and the screw connection 4. Thereby, the circuit board 1 is mechanically not loaded or only minimally, the circuit board 1 is not subjected to any mechanical stresses. Due to the transmission and application of the forces in immediately adjacently arranged areas, the forces exert no lever actions, in particular on the circuit board 1, which can also lead to mechanical stresses in the circuit board 1 or in the device 10. The forces occurring in the assembly of the busbars 2 with the pin connections 8 are transmitted into the device 10 and not via the circuit board 1.

Moreover, as a result of the possible lateral tolerance compensation of the device 10 with respect to the housing wall 7, in particular the pin connections 8 protruding therefrom, and with respect to the circuit board 1, no lateral force distributions occur during the assembly. A bending of the circuit board 1 is prevented.

Figure 5:
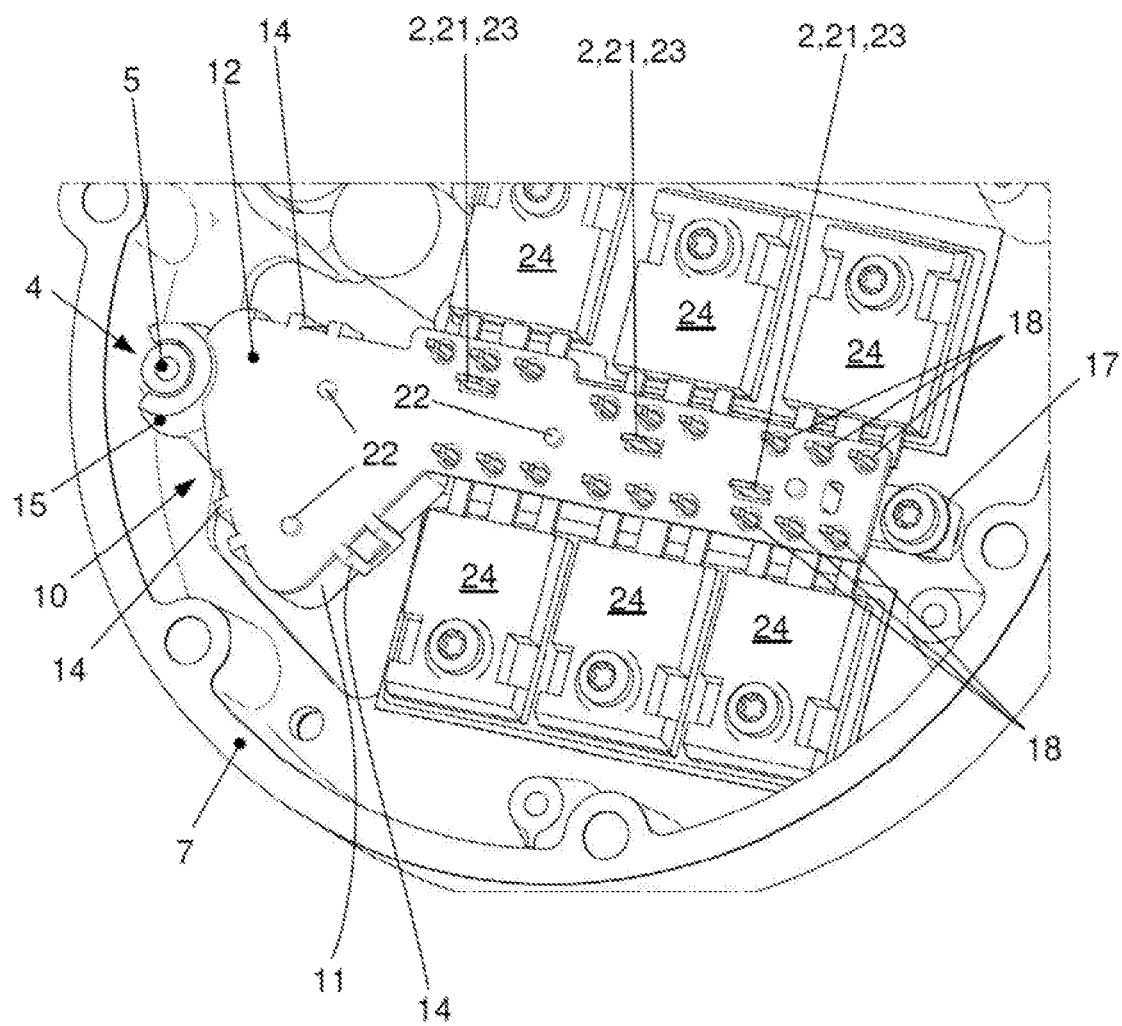
FIG. 5 shows a device for receiving and supporting busbars in the assembled state in a top view without circuit board.

FIG. 5 shows the device 10 for receiving and supporting busbars in the assembled state in a top view without circuit board. The circuit board is arranged above the device 10.

In the assembled state with the busbars 2 lying between the housing elements 11, 12 and thus inside, the device 10 is arranged with the first housing element 11 in direction of the housing wall 7. Here, the device 10 is fixed at the ends, on the one hand, to the screw base 6 of the screw connection 4 by means of the supporting element 15, and, on the other hand, to the fastening eyelet 17 via a screw connection.

For further connection to the circuit board 1, the plug connections 21 of the busbars 2 protrude through the passage openings 23 formed in the second housing element 12. In addition, connections of electronic components which are also arranged on the housing wall 7, in particular of semiconductor elements 24, are passed through the passage openings 18 and preliminarily fixed before the assembly of the circuit board 1 for the connection to the circuit board 1.

In the assembly of the circuit board 1, the plug connections 21 of the busbars 2 which protrude from the device 10, and connections of the semiconductor elements 24 engage from below into the circuit board 1 and can be soldered, for example.

By means of the formations 22 designed as spacers and the forming of the supporting element 15, the circuit board 1 is only in contact in certain areas, in particular in point-type contact, on the device 10.

LIST OF REFERENCE NUMERALS

1', 1 Circuit board
2', 2 Busbar
3', 3 Clamping device
4 Screw connection
5 Screw
6', 6 Screw base
7 Housing wall
8 Pin connection
9 Assembly direction
10 Device
11 First housing element device 10
12 Second housing element device 10

13 First locking element
14 Second locking element
15 Supporting element
16 Passage opening pin connection
17 Fastening eyelet
18 Passage opening connection
19 Formation of first housing element 11
20 Arrangement busbars 2
21 Plug connection busbar 2
22 Formation second housing element 12
23 Passage opening plug connection 21
24 Semiconductor element
F Force

What is claimed is:

1. A device for receiving and supporting busbars as electrical connecting elements for a circuit board, wherein the device is arranged in a gap between the circuit board and a housing wall, in contact with the circuit board and with the housing wall, the device comprising:
   a housing which receives and supports at least one busbar, and on a first end, includes a supporting element for holding the device on the housing wall, wherein the housing wall includes a screw base of a screw connection, wherein the supporting element is an eyelet wherein the supporting element encloses the screw base at least partially so that the screw base is disposed therein, and wherein the circuit board is connected to the housing wall in direct contact with a front side of the screw base and a front side of the supporting element, wherein the supporting element minimizes mechanical stresses transmitted to the circuit board when the at least one busbar is assembled to a pin connection protruding from the housing wall.

2. The device according to claim 1, wherein an inner side of the supporting element is conical, and an outer side of the screw base is conical, wherein the inner side of the supporting element and the outer side of the screw base correspond to one another and are in flat contact with one another.

3. The device according to claim 1, wherein the housing is formed from a first housing element and a second housing element.

4. The device according to claim 1, wherein the at least one busbar further comprises a clamping device on a first end, and the device, on a side facing the housing wall, includes at least one passage opening corresponding to arrangement of the clamping device, and wherein the pin connection protruding from the housing wall is inserted through the passage opening into the clamping device.

5. The device according to claim 4, wherein the at least one busbar further comprises a plug connection on a second end, and the device, on a side facing the circuit board, includes at least one passage opening corresponding to arrangement of the plug connection, and wherein the plug connection is arranged to protrude from the device through the passage opening corresponding to arrangement of the plug connection in a direction of the circuit board.

6. The device according to claim 1, wherein the housing of the device is formed from an electrically nonconductive material.

7. The device according to claim 3, wherein the first housing element and the second housing element include locking elements for clipping or locking to one another.

8. The device according to claim 1, wherein the supporting element has a slot and is an open eyelet.

9. The device according to claim 1, wherein the housing further comprises a fastening eyelet which is a through-hole for receiving a pin or a screw and which is formed on a second end of the device which is distal with respect to the first end.

10. The device according to claim 1, wherein the housing includes passage openings for implementation and preliminary fixation of electrical connections of electronic components arranged on the housing wall for connection to the circuit board.

11. The device according to claim 1, wherein the housing has formations as spacers, so the device is in contact with the housing wall by means of the formations.

12. The device according to claim 1, wherein the housing has formations as spacers, so that the device is in contact with the circuit board by means of the formations and the supporting element.

13. A use of the device according to claim 1 on an electrically driven compressor of a refrigerant circuit of an air conditioning system for conditioning air of a passenger space of a motor vehicle.

14. A device for receiving and supporting busbars as electrical connecting elements for a circuit board, wherein the device is arranged in a gap between the circuit board and a housing wall, in contact with the circuit board and with the housing wall, the device comprising:
   a housing which receives and supports at least one busbar, and on a first end, includes a supporting element for holding the device on the housing wall, wherein the housing wall includes a screw base of a screw connection, wherein the supporting element is an eyelet wherein the supporting element encloses the screw base at least partially, and wherein the circuit board is connected on a front side of the screw base to the housing wall, wherein the supporting element is designed in terms of dimensions in such a manner that it slides over the screw base in an assembly direction in which the circuit board is moved towards the housing wall wherein the screw base is a conical or a frusto-conical shape, a diameter of the screw base and a diameter of the supporting element are configured so that they taper in a direction opposite the assembly direction.

15. The device according to claim 14, wherein the supporting element minimizes mechanical stresses transmitted to the circuit board when the at least one busbar is assembled to a pin connection protruding from the housing wall.

* * * * *